United States Patent
Wu

(10) Patent No.: US 11,139,829 B1
(45) Date of Patent: Oct. 5, 2021

(54) DATA COMPRESSION TECHNIQUES USING PARTITIONS AND EXTRANEOUS BIT ELIMINATION

(71) Applicant: Beijing Tenafe Electronic Technology Co., Ltd., Beijing (CN)

(72) Inventor: Yingquan Wu, Palo Alto, CA (US)

(73) Assignee: Beijing Tenafe Electronic Technology Co., Ltd.

( * ) Notice: Subject to any disclaimer, the term of this patent is extended or adjusted under 35 U.S.C. 154(b) by 0 days.

(21) Appl. No.: 17/236,386

(22) Filed: Apr. 21, 2021

(51) Int. Cl.
*H03M 7/30* (2006.01)
*H04L 29/06* (2006.01)

(52) U.S. Cl.
CPC .......... *H03M 7/3086* (2013.01); *H04L 69/04* (2013.01)

(58) Field of Classification Search
CPC .............................. H03M 7/3086; H04L 69/04
USPC ....................................................... 341/51, 87
See application file for complete search history.

(56) References Cited

U.S. PATENT DOCUMENTS 9,438,271 B2 * 9/2016 Itani ...................... H03M 7/6011
10,303,402 B2 * 5/2019 Xie ........................ H03M 7/607

OTHER PUBLICATIONS

David A. Huffman, "A Method for the Construction of Minimum-Redundancy Codes", Proceedings of the I.R.E., pp. 1098-1101, Sep. 1952.
Ziv et al., "A Universal Algorithm for Sequential Data Compression", from IEEE Transactions on Information Theory, vol. IT-23, No. 3, May 1977.
P. Deutsch, "DEFLATE Compressed Data Format Specification version 1.3", Apr. 1996.
Peter Elias, "Universal Codeword Sets and Representations of the Integers", IEEE Transactions on Information Theory, vol. IT-21, No. 2, Mar. 1975.
Storer et al., "Data Compression via Textual Substitution", Journal of the Association for Computing Machinery, vol. 19, No. 4, Oct. 1982, pp. 928-951.

* cited by examiner

*Primary Examiner* — Khai M Nguyen
(74) *Attorney, Agent, or Firm* — Van Pelt, Yi & James LLP

(57) ABSTRACT

Partition information associated with partition(s) in a sliding window and an uncompressed value associated with a repeated sequence in the sliding window are received. A compressed value is generated using the uncompressed value, including by: generating the set indicator based at least in part on the partition information and the uncompressed value; determining, based at least in part on the partition information and the uncompressed value, whether the uncompressed value includes an extraneous bit; and generating the intra-set information, including by: in the event it is determined that the uncompressed value includes the extraneous bit, excluding the extraneous bit in the uncompressed value from the intra-set information. The compressed value is output.

20 Claims, 17 Drawing Sheets

| Values of X | SI | ISI | |
|---|---|---|---|
| $1 \leq X \leq 2^{w_1} - 1$ | 0 | $w_1$ bits of X | 445 |
| $2^{w_1} \leq X \leq 2^{(w_1+1)} - 1$ | 1 | $w - 1$ bits of X (Discard leading bit of X) | 446 |
| $2^{(w_1+1)} \leq X \leq 2^w - 1$ | 1 | $w$ bits of X | 447 |

Example Encoding with Extraneous Bit Elimination
(1 Partition/2 Sets)

| Values of X | Set Indicator (SI) | Partially Encoded Intra-Set Information (ISI) | |
|---|---|---|---|
| $1 \leq X \leq 2^{w_1} - 1$ | 0 | $w_1$ bits of X | 416 |
| $2^{w_1} \leq X \leq 2^w - 1$ | 1 | $w$ bits of X | 418 |

Partially Encoded Offset before Extraneous Bit Elimination

| Example Values of X (420) | X in Binary (421) | SI (422) | Partially Encoded ISI (423) | |
|---|---|---|---|---|
| 511 | 1 1111 1111 | 0 | 1 1111 1111 | 425 |
| 512 | <u>1</u>0 0000 0000 | 1 | 001<u>0</u> 0000 0000 | 426 |
| 1023 | <u>1</u>1 1111 1111 | 1 | 001<u>1</u> 1111 1111 | 427 |
| 1024 | 100 0000 0000 | 1 | 0100 0000 0000 | 428 |

Partially Encoded Offset Examples before Extraneous Bit Elimination when $w_1 = 9$ ($2^9 = 512$) and $w = 12$ ($2^{12} = 4096$)

FIG. 4C

| Example Values of X (430) | SI (431) | ISI (after Extraneous Bit Elimination) (432) | Length of SI + ISI (433) | |
|---|---|---|---|---|
| 511 | 0 | 1 1111 1111 | 10 | 435 |
| 512 | 1 | 00~~1~~0 0000 0000 000 0000 0000 | 12 | 436 |
| 1023 | 1 | 00~~1~~1 1111 1111 001 1111 1111 | 12 | 437 |
| 1024 | 1 | 0100 0000 0000 | 13 | 438 |

Encoded Offset Examples after Extraneous Bit Elimination when $w_1 = 9$ ($2^9 = 512$) and $w = 12$ ($2^{12} = 4096$)

FIG. 4D

| Values of X | SI | ISI | |
|---|---|---|---|
| $1 \leq X \leq 2^{w_1} - 1$ | 0 | $w_1$ bits of X | 445 |
| $2^{w_1} \leq X \leq 2^{(w_1+1)} - 1$ | 1 | $w - 1$ bits of X (Discard leading bit of X) | 446 |
| $2^{(w_1+1)} \leq X \leq 2^w - 1$ | 1 | $w$ bits of X | 447 |

Example Encoding with Extraneous Bit Elimination
(1 Partition/2 Sets)

FIG. 4E

| RXed SI | Received ISI | Modified ISI | Decoded Value of X | |
|---|---|---|---|---|
| 0 | 1 1111 1111 = 511 | -- | 511 | 605 |
| 1 | 000 0000 0000 = 0 | 0010 0000 0000 = 512 | 512 | 606 |
| 1 | 001 1111 1111 = 511 | 0011 1111 1111 = 1023 | 1023 | 607 |
| 1 | 0100 0000 0000 = 1024 | -- | 1024 | 608 |

Decoded Offset Examples with Replacement Bit Insertion when $w_1 = 9$ ($2^9 = 512$) and $w = 12$ ($2^{12} = 4096$)

FIG. 6A

| RXed SI (610) | Received ISI ($ISI_{RX}$) (611) | Decoded Value of X (612) | |
|---|---|---|---|
| 0 | $ISI_{RX} \leq 2^{w_1} - 1$ | $ISI_{RX}$ (Read out $w_1$ bits of $ISI_{RX}$) | 615 |
| 1 | $ISI_{RX} \leq 2^{w_1} - 1$ | $ISI_{RX} + 2^{w_1}$ (Read out $w - 1$ bits of $ISI_{RX}$) | 616 |
| 1 | $2^{(w_1+1)} \leq ISI_{RX} \leq 2^w - 1$ | $ISI_{RX}$ (Read out $w$ bits of $ISI_{RX}$) | 617 |

Example Decoding with Replacement Bit Insertion
(1 Partition and 2 Sets)

FIG. 6B

| Values of X | Set Indicator (SI) | Partially Encoded Intra-Set Information (ISI) | |
|---|---|---|---|
| $X \leq 2^{w_1} - 1$ | 0 | $w_1$ bits of X | 805 |
| $2^{w_1} \leq X \leq 2^{w_2} - 1$ | 10 | $w_2$ bits of X | 806 |
| $2^{w_2} \leq X \leq 2^{w} - 1$ | 11 | $w$ bits of X | 807 |

Partially Encoded Offset before Extraneous Bit Elimination
(2 Partitions and 3 Sets)

FIG. 8A

| | Example Values of X | X in Binary | Compressed Offset (SI \| ISI) | Length of SI + ISI |
|---|---|---|---|---|
| 820 | 255 | 1111 1111 | 0 \| 1111 1111 | 9 |
| 821 | 256 | <u>1</u> 0000 0000 | 10 \| 0 0000 0000<br>10 \| 0 0000 0000 | 11 |
| 822 | 511 | <u>1</u> 1111 1111 | 10 \| 0 1111 1111<br>10 \| 0 1111 1111 | 11 |
| 823 | 512 | 10 0000 0000 | 10 \| 10 0000 0000 | 12 |
| 824 | 1023 | 11 1111 1111 | 10 \| 11 1111 1111 | 12 |
| 825 | 1024 | <u>1</u>00 0000 0000 | 11 \| 0 00 0000 0000<br>11 \| 000 0000 0000 | 13 |
| 826 | 2047 | <u>1</u>11 1111 1111 | 11 \| 0 11 1111 1111<br>11 \| 011 1111 1111 | 13 |
| 827 | 2048 | 1000 0000 0000 | 11 \| 1000 0000 0000 | 14 |

Encoded Offset Examples with 2 Partitions and 3 Sets when $w_1 = 8$ ($2^8 = 256$), $w_2 = 10$ ($2^{10} = 1024$), and $w = 12$ ($2^{12} = 4096$)

FIG. 8B

| Values of X | SI | ISI | Length of SI +ISI | |
|---|---|---|---|---|
| $X \leq 2^{w_1} - 1$ | 0 | $w_1$ bits of X | $w_1 + 1$ | 840 |
| $2^{w_1} \leq X \leq 2^{(w_1+1)} - 1$ | 10 | $w_2 - 1$ bits of X (Discard leading bit of X) | $w_2 + 1$ | 841 |
| $2^{(w_1+1)} \leq X \leq 2^{w_2} - 1$ | 10 | $w_2$ bits of X | $w_2 + 2$ | 842 |
| $2^{w_2} \leq X \leq 2^{(w_2+1)} - 1$ | 11 | $w - 1$ bits of X (Discard leading bit of X) | $w + 1$ | 843 |
| $2^{(w_2+1)} \leq X \leq 2^{w} - 1$ | 11 | $w$ bits of X | $w + 2$ | 844 |

Columns: 830, 831, 832, 833

Encoded Offset with 2 Partitions and 3 Sets after Extraneous Bit Elimination

FIG. 8C

| RXed SI | Received ISI ($ISI_{RX}$) | Decoded Value of X | |
|---|---|---|---|
| 0 | $ISI_{RX} \leq 2^{w_1} - 1$ | $ISI_{RX}$ (Read out $w_1$ bits of $ISI_{RX}$) | 910 |
| 10 | $ISI_{RX} \leq 2^{w_1} - 1$ | $ISI_{RX} + 2^{w_1}$ (Read out $w_2 - 1$ bits of $ISI_{RX}$) | 911 |
| 10 | $2^{(w_1+1)} \leq ISI_{RX} \leq 2^{w_2} - 1$ | $ISI_{RX}$ (Read out $w_2$ bits of $ISI_{RX}$) | 912 |
| 11 | $ISI_{RX} \leq 2^{w_2} - 1$ | $ISI_{RX} + 2^{w_2}$ (Read out $w - 1$ bits of $ISI_{RX}$) | 913 |
| 11 | $2^{(w_2+1)} \leq ISI_{RX} \leq 2^{w} - 1$ | $ISI_{RX}$ (Read out $w$ bits of $ISI_{RX}$) | 914 |

Columns labeled 900, 901, 902.

Example Decoding with Replacement Bit Insertion
(2 Partitions and 3 Sets)

FIG. 9

DATA COMPRESSION TECHNIQUES USING PARTITIONS AND EXTRANEOUS BIT ELIMINATION

BACKGROUND OF THE INVENTION

Many popular compression techniques encode data by indicating in the compressed and encoded data where a repeated sequence occurs. In some such compression techniques, these repeated sequences are identified by an offset and length pair (e.g., the repeated sequence can be found at <offset> from the present location or time index and has a length of <length>) and in some cases these offsets and lengths are themselves compressed.

Suppose that an offset (e.g., X where X≥1) is to be compressed. Let $n=\lfloor \log_2 X \rfloor$ be the highest power of 2 in X, such that $2^n \leq X < 2^{n+1}$. Let $l=\lfloor \log_2(n+1) \rfloor$ be the highest power of 2 in (n+1) so that $2^l \leq n+1 < 2^{(l+1)}$. With an Elias Delta encoder, the encoder would write l zeros, followed by the (l+1)-bit binary representation of (n+1), followed by all but the leading bit (i.e., the last n bits) of X. The encoded bit length, denoted by L, is governed by $L(X)=\lfloor \log_2 X \rfloor +1+ 2\lfloor \log_2(\log_2 X) +1)$. With a Huffman encoder, the encoder would encode the leading two bits of X into a Huffman code and then write the corresponding pre-fix word, followed by the last (n−1) bits of X.

One drawback of the Huffman encoding technique is that although the compression achieved is better than that of the Elias Delta encoding technique, Huffman encoders require a pre-pass filter to collect frequencies. New compression encoding techniques which offer better compression than Elias Delta but are less complex compared to Huffman (e.g., they do not require pre-pass frequency collection) would be desirable for some applications.

BRIEF DESCRIPTION OF THE DRAWINGS

Various embodiments of the invention are disclosed in the following detailed description and the accompanying drawings.

FIG. 4C is a table illustrating an embodiment of partially encoded offsets before extraneous bit elimination when $w_1=9$ and $w=12$.

FIG. 4D is a table illustrating an embodiment of compressed offsets after extraneous bit elimination when $w_1=9$ and $w=12$.

FIG. 4E is a table illustrating an embodiment of an encoding process which generates compressed offsets, including by eliminating extraneous bits.

FIG. 6A is a table illustrating an embodiment of decompressed offsets after replacement bit insertion when $w_1=9$ and $w=12$.

FIG. 6B is a table illustrating an embodiment of decoding with replacement bit insertion with one partition and two sets.

FIG. 8A is a table illustrating an embodiment of a partial encoding scheme using a sliding window with two partitions and three sets before extraneous bit elimination.

FIG. 8B is a table illustrating an embodiment of encoded offsets where extraneous bits are eliminated using two partitions and three sets when $w_1=8$, $w_2=10$, and $w=12$.

FIG. 8C is a table illustrating an embodiment of encoded offsets where extraneous bits are eliminated using two partitions and three sets.

FIG. 9 is a table illustrating an embodiment of decoding with replacement bit insertion with two partitions and three sets.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Various examples of compression encoders are described herein. In some embodiments, an encoder uses a sliding window with a plurality of partitions that permits extraneous bits to be discarded and which in turn improves the compression rate without a significant increase in processing resources (e.g., this technique does not require a pre-pass filter).

Figure 1:
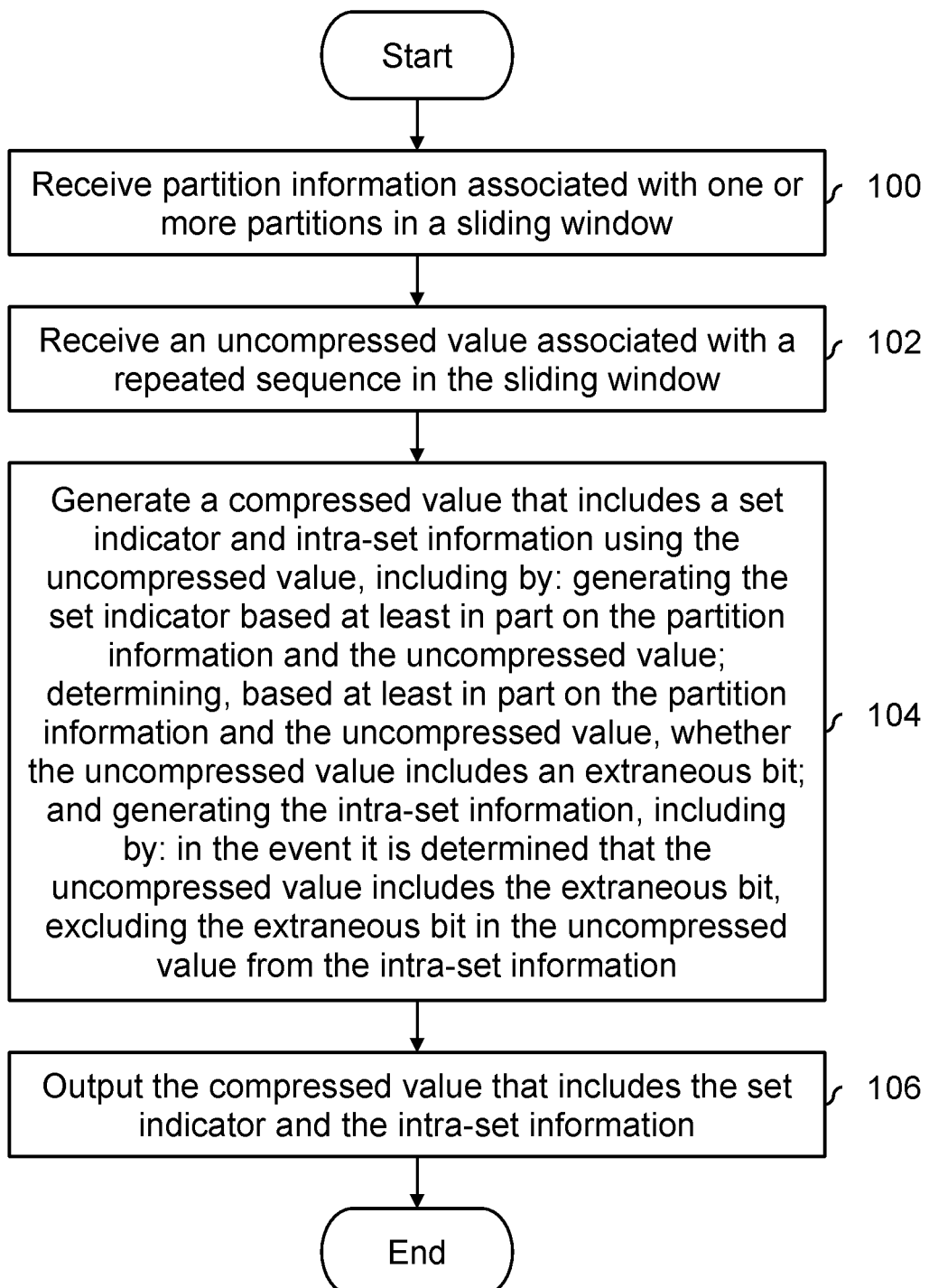
FIG. 1 is a flowchart illustrating an embodiment of an encoding process that generates a compressed value using a sliding window with a plurality of partitions where extraneous bits are excluded from the compressed value.

FIG. 1 is a flowchart illustrating an embodiment of an encoding process that generates a compressed value using a sliding window with a plurality of partitions where extraneous bits are excluded from the compressed value. In this example, the value being compressed is associated with a repeated sequence (e.g., the uncompressed value is an offset or length that identifies an earlier version of the repeated sequence). As such, the example process may be performed by an offset and/or length encoder that receives offset and/or length values associated with repeated patterns or sequences (e.g., from a match identifier which identifies repeated patterns or sequences in a sliding window) and encodes (i.e., compresses) the offsets and/or lengths of the repeated sequences. Although the example of FIG. 1 compresses a value associated with a repeated sequence, it is noted that any value (not just those associated with a repeated sequence) may be compressed and/or encoded using the techniques described herein.

At 100, partition information associated with one or more partitions in a sliding window is received. In examples described herein, an overarching compression process finds repeated patterns or sequences in uncompressed input data and replaces a repeated sequence with a reference to an earlier copy of that sequence. To identify such repeated sequences in the uncompressed input data, the encoder uses a sliding window to store older symbols (e.g., bits) from the uncompressed input data. In examples described herein, the size of the sliding window is a power of 2 (e.g., $2^w$ where w is a positive integer). For example, if w=12, then the sliding window stores $2^{12}$=4096 symbols from the (uncompressed) input data and from which repeated sequences are searched for.

The sliding window has one or more partitions which divide the sliding window into a plurality of sets; the partition information that is received at step 100 may include the location or position of a partition within the sliding window. In some examples described herein, a partition has a location or position that is a power of 2 (e.g., $2^{w_1}$ where $w_1$ is a positive integer and $w_1<w$). Examples of partitions and how they are used in the encoding process (and conversely, the decoding process) are described in more detail below.

At 102, an uncompressed value associated with a repeated sequence in the sliding window is received. In some embodiments, the uncompressed value (e.g., that is being compressed and/or encoded) is the offset and/or length from an offset-length pair that identifies an earlier location or position of a repeated sequence that is repeated at the current position. For example, the offset (X where X≥1) may describe the start of the matching sequence (e.g., within the sliding window and from the current position or time index) and the length may describe the length of the matching sequence from the specified offset. By compressing an offset and/or length that identifies the location of a repeated sequence, the input data may be compressed even more (e.g., compared to if repeated sequences were used but the offset and length were not compressed).

At 104, a compressed value that includes a set indicator and intra-set information is generated using the uncompressed value, including by: generating the set indicator based at least in part on the partition information and the uncompressed value; determining, based at least in part on the partition information and the uncompressed value, whether the uncompressed value includes an extraneous bit; and generating the intra-set information, including by: in the event it is determined that the uncompressed value includes the extraneous bit, excluding the extraneous bit in the uncompressed value from the intra-set information.

As will be described in more detail below, encoding and/or compressing the value (e.g., the offset and/or length) includes generating a set indicator that indicates which set a value falls in (e.g., if there is only one partition dividing up the sliding window, then does the uncompressed value fall into the lower set or the higher set?). Generally speaking, each set is associated with a unique and/or non-overlapping range of values. Thus, if a value is within one set (e.g., an upper of two sets), that value cannot also fall into another set (e.g., a lower of two sets). As a result of this observation, some uncompressed values have a bit that is extraneous (e.g., not needed to decode and restore the original, uncompressed value) if the set indicator is also known; these extraneous bits are discarded or otherwise excluded from the intra-set information without loss of information where possible. Some examples of this are described in more detail below.

At 106, the compressed value that includes the set indicator and the intra-set information is output. In this example, the compressed value that is output is associated with a repeated sequence but some other sections or portions of the (e.g., final) output data may include sections where a repeated sequence was not found in the sliding window and so the output data comprises or otherwise includes the original, uncompressed data in those sections (e.g., or some other encoded, compressed information).

Before describing more detailed examples of the encoding process shown in FIG. 1, it may be helpful to illustrate some example applications. The following figures illustrate some example applications of the compression techniques described herein.

Figure 2A:
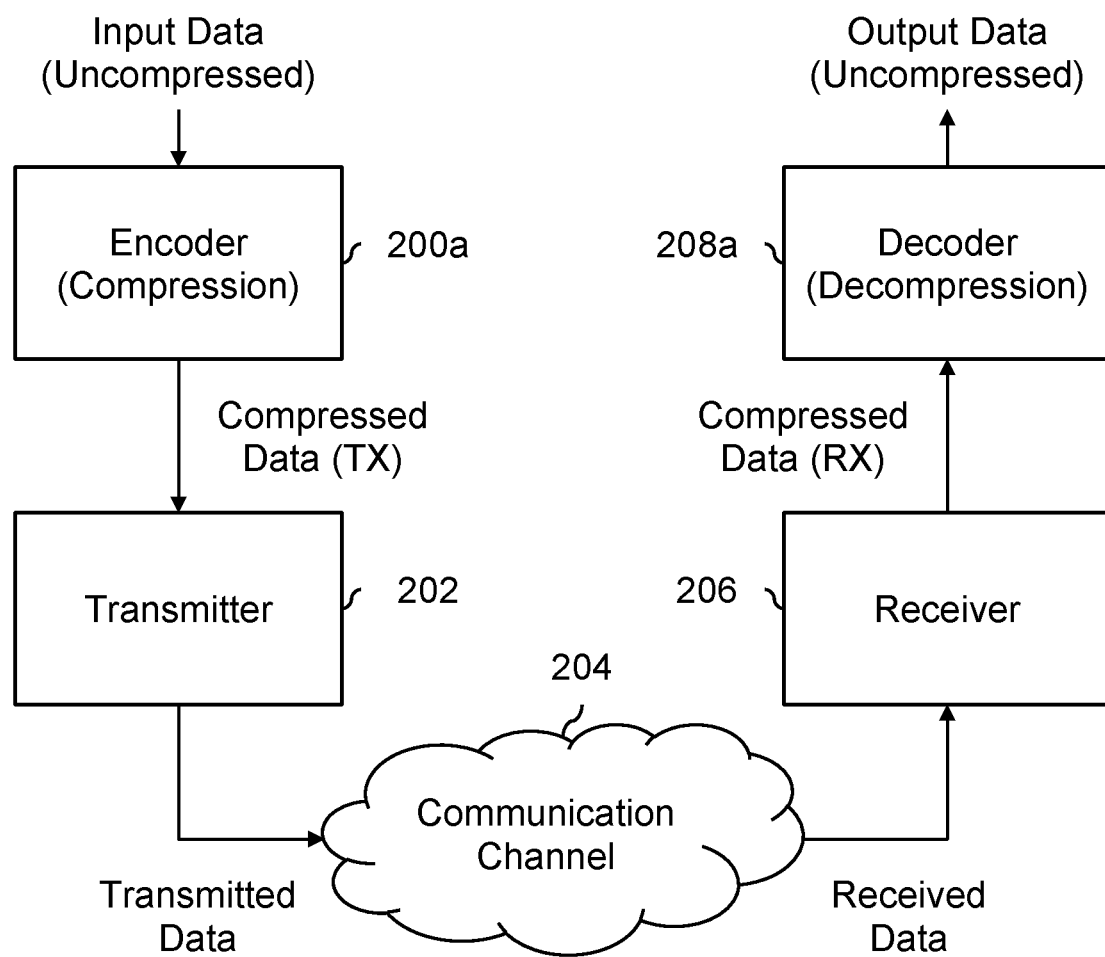
FIG. 2A is a diagram illustrating an embodiment of a compression encoder and decompression decoder used in a communications application.

FIG. 2A is a diagram illustrating an embodiment of a compression encoder and decompression decoder used in a communications application. In this example, input (i.e., uncompressed) data is input to an encoder (200a). In some embodiments, the encoder (200a) performs the encoding process of FIG. 1. Compressed data to transmit is output from the encoder (200a) and is passed to a transmitter (202) which modulates and/or formats the compressed data as appropriate for the particular communication channel and sends transmitted data over a communication channel (204), such as a wired or wireless channel and/or a network.

A receiver (206) coupled to the communication channel (204) inputs received data and demodulates and/or extracts the received compressed data from the received data. A decoder (208a) then decodes the received, compressed data and outputs the uncompressed data. For ease of explanation, various encoding examples are described in detail before decoding examples are described. As such, exemplary decoding processes that the decoder (208a) may perform will be described in more detail below.

The communication channel (204) has a limited and/or fixed amount of transmission capacity and therefore compressing data prior to transmission may reduce instances when transmissions need to be dropped or delayed due to the communication channel (204) being fully utilized.

Figure 2B:
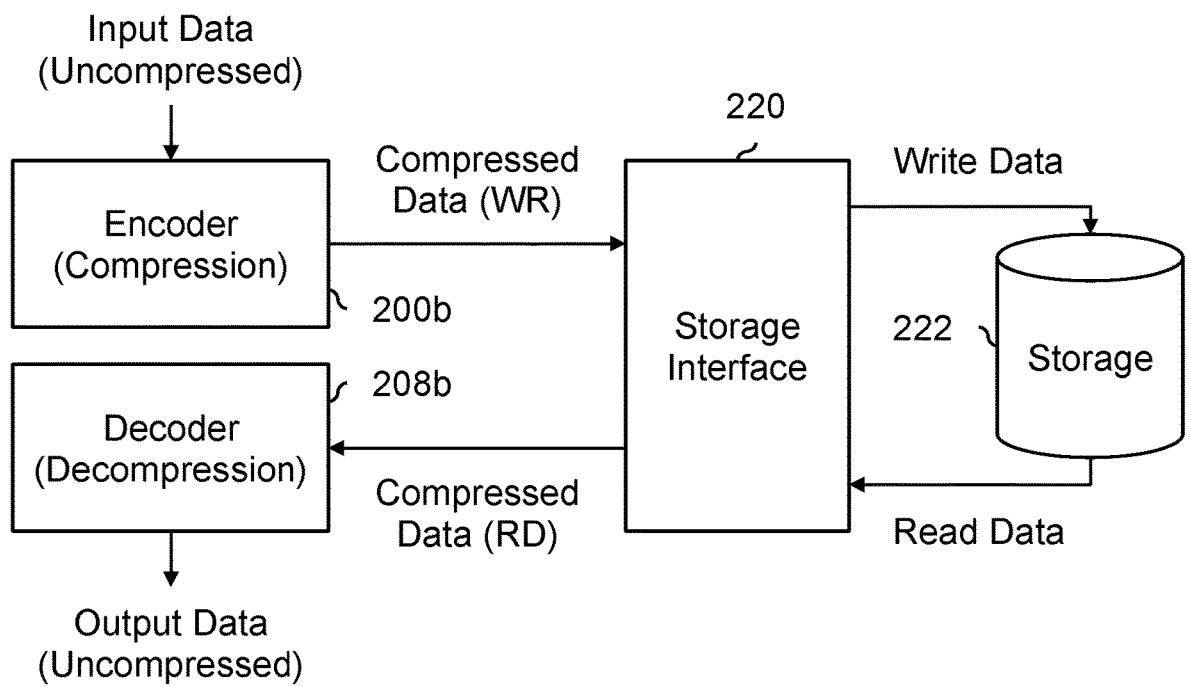
FIG. 2B is a diagram illustrating an embodiment of a compression encoder and decompression decoder used in a storage application.

FIG. 2B is a diagram illustrating an embodiment of a compression encoder and decompression decoder used in a storage application. In this example, uncompressed input data is passed to an encoder (200b). In some embodiments, the encoder (200b) performs the encoding process of FIG. 1. The encoder passes compressed data to be written to storage interface (220) which in turn writes data to storage (222). The storage has a limited and/or fixed amount of storage capacity and by compressing data before storage, more (e.g., useful and/or payload) information may be stored.

To obtain the original data, the storage interface (220) reads back data stored on the storage (222) and passes the compressed data that is read back to the decoder (208b). The decoder (208b) decompresses the read back data and outputs the decompressed data.

The following figure shows a block diagram of an exemplary encoding system that performs the process of FIG. 1.

Figure 3:
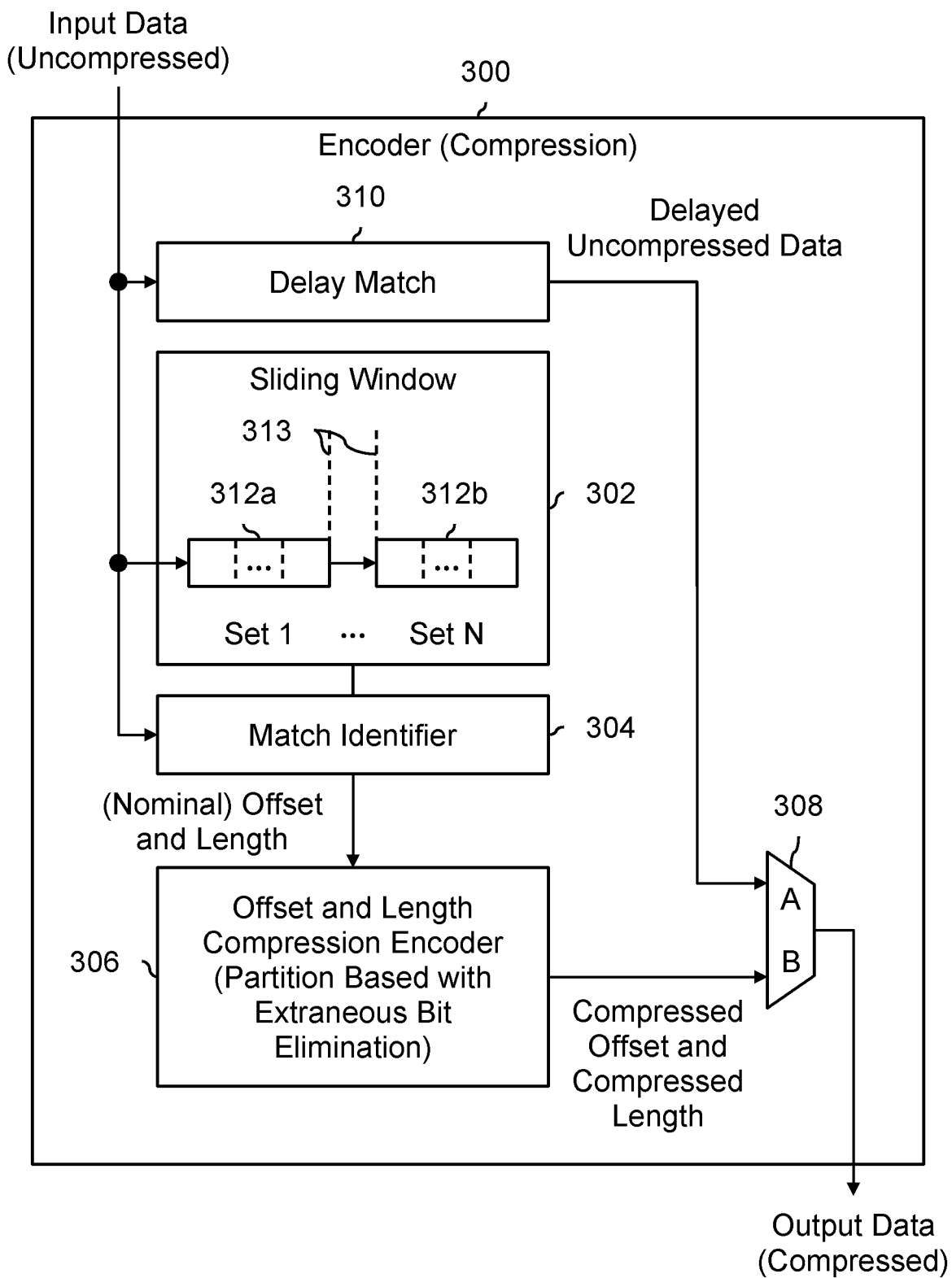
FIG. 3 is a diagram illustrating an embodiment of an encoder that is configured to generate compressed offsets and lengths using a sliding window with one or more partitions which in turn permits extraneous bits to be excluded from the compressed offsets and lengths.

FIG. 3 is a diagram illustrating an embodiment of an encoder that is configured to generate compressed offsets and lengths using a sliding window with one or more partitions which in turn permits extraneous bits to be excluded from the compressed offsets and lengths. In some embodiments, the encoder (200a) in FIG. 2A and/or the encoder (200b) in FIG. 2B is implemented as shown here. In some embodiments, the encoder (300) is implemented in hardware, such as an application-specific integrated circuit (ASIC) or a field-programmable gate array (FPGA). Alternatively, the encoder (300) may be implemented in software and/or a computer program product (e.g., embodied in a non-transitory computer readable medium and comprising computer instructions).

In this example, (uncompressed) input data is input by the encoder (300). Within the encoder (300), the input data is passed to a sliding window (302) which stores 2 symbols (e.g., bits) of the input data which are searched by the match identifier (304) for repeated patterns or sequences. In some embodiments, the match identifier uses hashing functions to efficiently search for matches.

When a match is found, the match identifier (304) passes the (nominal) offset and length of the located match (e.g., where the offset identifies the beginning of the repeated sequence from a current position or location and the length specifies the length of the repeated sequence) to an offset and length compression encoder (306) that compresses the offset and length based on the partition information (e.g., where the partition(s) divide the sliding window into sets) and by eliminating extraneous bits.

Although this example shows both the offset and the length being compressed using the same exemplary encoding process, in some embodiments the exemplary compression techniques described herein are only used to compress one value in an offset and length pair and some other compression technique is used to compress the other value.

A multiplexer (308) generates the compressed output data by selecting between the compressed offset and compressed length from the offset and length compression encoder (306) when a repeated sequence is identified and a delayed version of the uncompressed data generated by a delay match block (310) when a repeated sequence is not identified. For example, the delay match (310) may be tuned so that the signal at the A input (e.g., when a match is not found) matches the latency of the signal at the B input (e.g., when a match is found). In some embodiments, the multiplexer (308) or some other component(s) insert a header and/or reserved sequences or patterns that identify the start of a new section and indicate what type of section that section is (e.g., repeated sequence or not). As shown in the examples of FIG. 2A and FIG. 2B, the compressed output data may then be sent over a communication channel or stored.

Returning briefly to the sliding window (302), the sliding window includes one or more partitions (313) which divide the sliding window into a plurality of sets (312a and 312b); the following figures show more detailed examples of how the offset and length encoder (306) uses the partition (e.g., location) information to encode the offset and length.

Figures 4A, 4B:
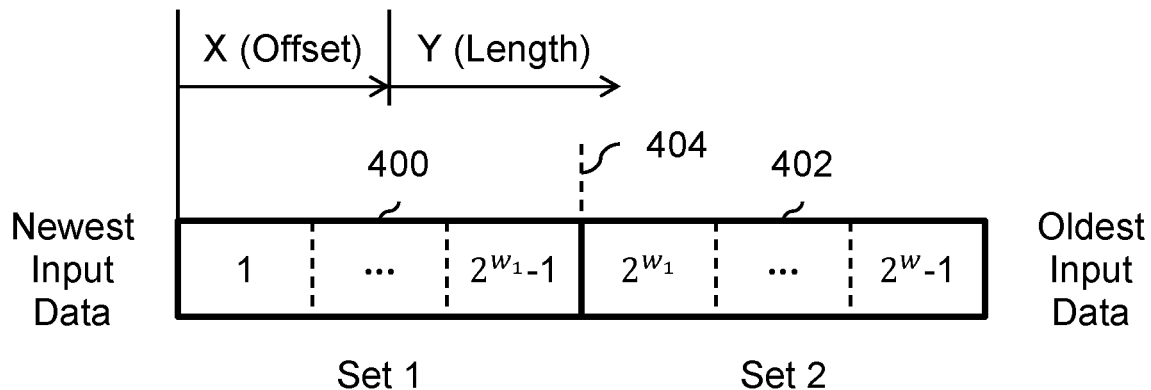
FIG. 4A is a diagram illustrating an embodiment of a sliding window with one partition and two sets.
FIG. 4B is a table illustrating an embodiment of partially encoded offsets before extraneous bit elimination.

FIG. 4A is a diagram illustrating an embodiment of a sliding window with one partition and two sets. In this example, symbols from the input data are shifted in from the left side of the first set (400) and are then shifted into the second set (402). The two sets (400 and 402) are created or otherwise defined by the partition (404) dividing up the sliding window. In this example, the first set (400) stores the $1^{st}$ through $(2^{w_1}-1)^{th}$ symbols of the input data and the second set (402) stores the $(2^{w_1})^{th}$ through $(2^w-1)^{th}$ symbols of the input data (i.e., $w > w_1$). In various embodiments, receiving the partition information at step 100 in FIG. 1 includes receiving the value of $w_1$, $2^{w_1}$, etc.

The offset value (X) (e.g., output by a match identifier) identifies where a repeated sequence begins within the sliding window and/or two partitions (e.g., relative to a current position and/or the newest symbol in the input data). The length value (Y) (e.g., output by a match identifier) specifies how many symbols are included in the repeated sequence (e.g., beginning at the offset and then going towards right from the newer symbols towards the older symbols).

Some examples described herein have a sliding window size of 4092 (i.e., w=12) which may be desirable in some applications because it reduces latency and/or maximizes the compression rate. Consider, for example, data compression in prime storage servers (e.g., where the encoder/decoder is implemented in software) and/or in storage disks (e.g., where the encoder/decoder is implemented in hardware) where latency is critical and data size is limited to ~4K (e.g., 4096) or ~8K (e.g., 8192) because data from the prime storage servers or storage disks is transferred over in units or blocks of that size. By setting the size of the sliding window to match that of the data size, the latency is reduced and/or the compression rate is maximized. In some applications, a sliding window size of ~4K or ~8K is relatively small compared to some other applications (e.g., that use a sliding window size of ~32K) but it may be desirable because it reduces the scope of the search and/or less memory is required to implement the sliding window.

To more clearly illustrate the encoding technique and its associated improvement to the compression rate, the following figures first describe a partially encoded example where extraneous bits are not excluded (e.g., so that those extraneous bits can be illustrated and discussed). Then, subsequent figures will describe how such extraneous bits are discarded or otherwise excluded from the encoded values by the exemplary encoder without loss of information.

FIG. 4B is a table illustrating an embodiment of partially encoded offsets before extraneous bit elimination. In this example, the offset (X) is encoded; for brevity, an example that encodes the length (Y) is not described herein. The leftmost column (410) of the table describes values of the offset (X) that are associated with the two sets in this example: $1 \leq X \leq 2^{w_1}-1$ (see the top row (416)) which is associated with a first set (e.g., set 1 (400) in FIG. 4A) and $2^{w_1} \leq X \leq 2^w-1$ (see the bottom row (418)) which is associated with a second set (e.g., set 2 (402) in FIG. 4A).

The set indicator (SI) values shown in the center column (412) show one example of a set indicator that is generated at step 104 in FIG. 1. In this example, if the offset is within the first set, then the set indicator (412) is set to 0 (see the top row (416)). If the offset is within the second set, then the set indicator (412) is set to 1 (see the bottom row (418)).

In addition to the set indicator, the offset and length encoder generates intra-set information (ISI) to completely and/or fully specify the offset value (X), for example, within the context of whatever partition the offset value is within. The right column (414) shows the partially encoded intra-set information (ISI) for the two sets. In this example, the intra-set information is only partially encoded (e.g., extraneous bits have not yet been discarded) so that those extraneous bits can be discussed.

If the offset (X) is within the first set, then the partially encoded intra-set information includes $w_1$ bits of the offset (X) per the top row (416). For example, if an offset (X) is within the first set, then by definition that means that X is strictly less than $2^{w_1}$ and therefore X can accurately represented or otherwise expressed using $w_1$ bits. If the offset (X) is within the second set, then the partially encoded intra-set information includes w bits of the offset (X) per the bottom row (418). If needed, the partially encoded intra-set information is zero padded to reach the prescribed number of bits (e.g., $w_1$ or w).

FIG. 4C is a table illustrating an embodiment of partially encoded offsets before extraneous bit elimination when $w_1=9$ and w=12. In this example, the leftmost column (420) shows four example values of the offset (X): 511, 512, 1023, and 1024 in rows 425-428, respectively. The second from left column (421) shows those values of X in binary: 1 1111 1111, 10 0000 0000, 11 1111 1111, and 100 0000 0000, in rows 425-428, respectively. For readability, spaces are inserted between every four bits in this figure and other figures.

The second from right column (422) shows the set indicator (SI) values for the example offset values: 0, 1, 1, and 1, in rows 425-428, respectively, per the partial encoding scheme described in FIG. 4B. For example, since $w_1=9$ and $2^9=512$, only the offset value of 511 (see the top row (425)) is within the first set and therefore has a set indicator value of 0. The rest of the example values of X (see the bottom three rows (426-428)) have a set indicator value of 1. This follows the set indicator encoding described in the center column (412) in FIG. 4B.

The rightmost column (423) shows the partially encoded intra-set information (ISI) for the example offset values: 1 11111111 (which has a length of $w_1$ bits), 0010 0000 0000 (which has a length of w), 0011 1111 1111 (which has a length of w), and 0100 0000 0000 (which has a length of w) in rows 425-428, respectively. This follows the partially encoded intra-set information encoding described in the rightmost column (414) in FIG. 4B.

In this example, the offset values (X) that are within the range of 512 through 1023 (see the two middle rows (426-428)) have a $10^{th}$ from right bit (indicated with an underline in columns 421 and 423) that is not needed and/or is extraneous if it is known that the offset value (X) falls within the second set (e.g., given that SI=1). If an offset value (X) falls within the second set then by mutual exclusion that offset value (X) cannot be within the range of 1 through 511 or else it would have been categorized as falling into the first set, not the second set. Therefore, for $512 \leq X \leq 1023$, the $(w_1+1)^{th}$ from right bit (in this example, the $10^{th}$ from right bit) is removed or otherwise excluded from the encoded offset. More formally, the leading bit of the subset $[2^{w_1}, 2^{(w_1+1)}-1]$ when SI=1 can be removed to become $[0, 2^{w_1}-1]$ without ambiguity. Therefore, the subset $[2^{w_1}, 2^{(w_1+1)}-1]$ is encoded with only w bits.

Conceptually, this is the same thing as "shifting" the offset values (X) that are in the range of 512 through 1023 into the "unused" range of 1 through 511 (where "unused" is in the context of or relative to the second set). The "shifted" offset values (e.g., $512 \leq X \leq 1023$ before shifting) associated with the second set are distinguishable from "un-shifted" offset values associated with the first set because SI=1 for the former but SI=0 for the latter.

Values of X that are greater than or equal to 1024 in this example do not have an extraneous bit because the 0 from right bit is needed during decoding. For example, 1024 (in binary, 100 0000 0000) and 1536 (in binary, 110 0000 0000) are identical except for the $10^{th}$ from right bit so that bit is not extraneous for values of X that are greater than or equal to 1024.

The following figure shows the encoding when this extraneous bit is eliminated from the encoded and/or compressed output.

FIG. 4D is a table illustrating an embodiment of compressed offsets after extraneous bit elimination when $w_1=9$ and w=12. In this example, the leftmost column (430) shows example values of the offset (X). The second from left column (431) shows the set indicator (SI). The second from right column (432) shows the intra-set information (ISI) after the extraneous bit is eliminated for those offset values of $512 \leq X \leq 1023$ (see, e.g., the two middle rows (436 and 437)). In this example, the 10th from right bit (also referred to herein as the leading bit) is the extraneous bit that is discarded and is shown with a strikethrough. Another way to describe this is that $2^{w_1}$ is subtracted from X when $512 \leq X \leq 1023$.

The rightmost column (433) shows the lengths of the compressed offsets (i.e., the length of SI+ISI). In this example, the compressed offsets have a length of 10 (see, e.g., the top row (435)), a length of 12 (see, e.g., the two middle rows (436 and 437)), and a length of 13 (see, e.g., the bottom row (438)), respectively.

The following figure describes this compression encoding more formally and/or generally.

FIG. 4E is a table illustrating an embodiment of an encoding process which generates compressed offsets, including by eliminating extraneous bits. In this example, the left column (440) shows example values of the offset (X), the center column (441) shows the corresponding set indicator value (SI), and the right column (442) shows the corresponding intra-set information (ISI) with the extraneous bit eliminated, where applicable. In terms of inputs and outputs of the encoder, the left column (440) is the input to the exemplary compression encoder and output of the encoder includes the center column (441) and the right column (442).

In this example, if $1 \leq X \leq 2^{w_1}-1$, then the set indicator (SI) is set to 0 and the intra-set information (ISI) is $w_1$ bits of X per the top row (445). If $2^{w_1} < X \leq 2^{(w_1+1)}-1$, then SI=1 and ISI=w−1 bits of X (e.g., the leading bit of X is discarded before zero padding) per the middle row (446). If $2^{(w_1+1)} \leq X \leq 2^w-1$, then SI=1 and ISI=w bits of X per the bottom row (447). If extra bits are needed to meet the number of prescribed bits, zero padding is performed.

As shown in the examples of FIGS. 4A-4E, in some embodiments, a first partition in the sliding window is located at $2^{w_1}$; in the event the uncompressed value is within a range of $[2^{w_1}, 2^{(w_1+1)}-1]$: the uncompressed value is determined to include the extraneous bit; and the extraneous bit in the uncompressed value that is excluded from the intra-set information includes a leading bit within the range of $[2^{w_1}, 2^{(w_1+1)}-1]$.

One benefit of this encoding technique is that it offers a comparable compression rate compared to some other compression techniques (e.g., Huffman encoders) but does not require a priori knowledge of the distribution of the uncompressed data (e.g., unlike Huffman encoders). More specifically, the described encoding technique does not require pre-pass filters to collect frequencies and is therefore less complex and/or smaller compared to Huffman encoders while offering comparable compression performance.

Furthermore, the compression rate is better than some other encoders (e.g., Elias Delta) but at substantially the same complexity and/or size. For example, dropping extraneous bits where possible from the encoded data further improves the compression rate compared to Elias Delta encoders at negligible cost to complexity and/or size.

In general, the exemplary compression technique described herein permits fast compression using relatively small sliding windows (e.g., where a smaller sliding window reduces complexity and latency) and performs using relatively low complexity and and/or relatively small components compared to other compression techniques.

The following figures describe a decoding process (corresponding to the encoding examples described above) followed by a specific decoding example with one partition (i.e., two sets) in the sliding window where $w_1=9$ and $w=12$.

Figure 5:
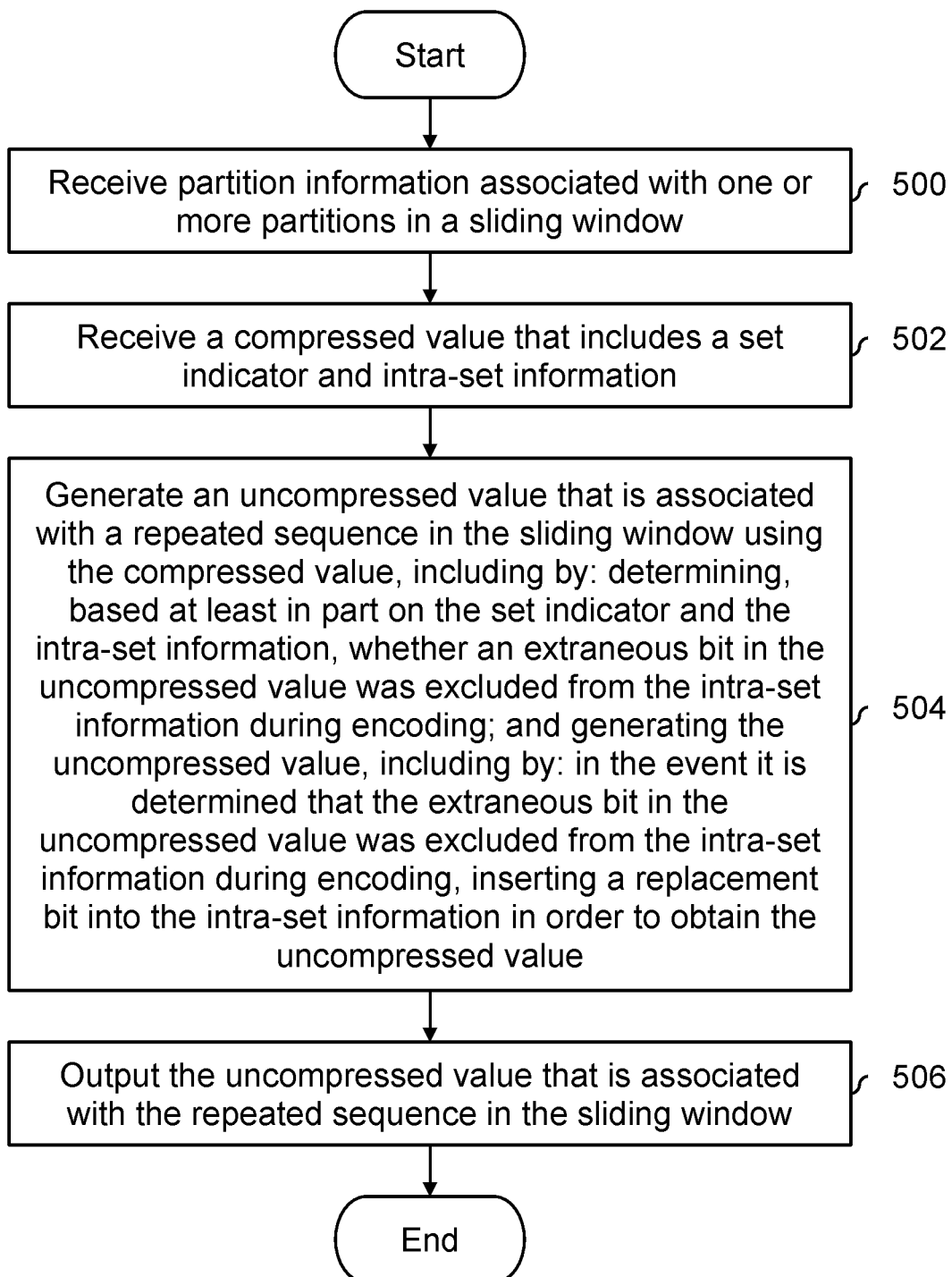
FIG. 5 is a flowchart illustrating an embodiment of a decoding process that generates a decompressed value using a sliding window that includes a plurality of partitions and where extraneous bits are sometimes excluded from a compressed value.

FIG. 5 is a flowchart illustrating an embodiment of a decoding process that generates a decompressed value using a sliding window that includes a plurality of partitions and where extraneous bits are sometimes excluded from a compressed value. FIG. 5 shows a decoding process that corresponds to the encoding process of FIG. 1. In one example application, the process is performed by an offset and length decompression decoder (e.g., that corresponds to the offset and length compression encoder (306) shown in FIG. 3).

At 500, partition information associated with one or more partitions in a sliding window is received. For example, for the partition (404) shown in FIG. 4A, the value of $w^1=9$ and/or $2^9=512$ may be received.

At 502, a compressed value that includes a set indicator and intra-set information is received. See, for example, the set indicator (441) and intra-set information (442) that are generated in the one partition/two sets example in FIG. 4E.

At 504, an uncompressed value that is associated with a repeated sequence in the sliding window is generated using the compressed value, including by: determining, based at least in part on the set indicator and the intra-set information, whether an extraneous bit in the uncompressed value was excluded from the intra-set information during encoding; and generating the uncompressed value, including by: in the event it is determined that the extraneous bit in the uncompressed value was excluded from the intra-set information during encoding, inserting a replacement bit into the intra-set information in order to obtain the uncompressed value. Some examples of this are described in more detail below.

At 506, the uncompressed value that is associated with a repeated sequence in the sliding window is output. For example, the uncompressed value may be an offset that specifies the beginning of the repeated sequence within a sliding window from a current position or time index. The retrieved repeated sequence is then inserted into a stream of uncompressed and/or output data (e.g., in place of a reference to and/or information about the repeated sequence).

The following figures describe some decoding examples with specific offset values, partition locations, and window sizes.

FIG. 6A is a table illustrating an embodiment of decompressed offsets after replacement bit insertion when $w_1=9$ and $w=12$. In this example, there are one partition and two sets (see, e.g., FIG. 4A) and the decoded values of X match those in the example of FIG. 4D. In this example, the leftmost column (600) shows some exemplary received set indicators (SI) and the second from left column (601) shows the corresponding received intra-set information (ISI).

As described above, the exclusion of extraneous bits from the intra-set information during encoding is detectable because the value indicated by the received intra-set information (601) does not match the range of values associated with the received set indicator (600). For example, in the second row (606), the received intra-set information (601) has a base 10 value of 0 but the received set indicator (600) indicates that the value should be between 512 and 1023. The same goes for the third row (607) where the received intra-set information (601) has a value of 511 and the received set indicator (600) value of 1 contradict each other.

As such, a replacement bit with a value of 1 is inserted (e.g., at the 10th from right place) into the received intra-set information (601) to obtain modified intra-set information (602) in the second and third rows (606 and 607) because of the contradictory received information. The inserted replacement bits are indicated in the second from right column (602) with an underline. Another way to describe this is that $2^{w_1}$ (e.g., 512 when $w_1=9$) is added to the received ISI (601) to obtain the modified ISI (602) when the received SI (600) and received ISI (601) contradict each other. The modified intra-set information (602), if any, or the received ISI (601), if appropriate, is then used to obtain the decoded and/or uncompressed value of X shown in the rightmost column (603).

In contrast, the first and fourth rows (605 and 608) have set indicators (600) and intra-set information (601) that do not contradict each other and therefore no modified intra-set information (602) is generated for those examples; the decoded values of X for those rows (605 and 608) are generated from the received intra-set information (601).

The following figure describes this more formally and/or generally.

FIG. 6B is a table illustrating an embodiment of decoding with replacement bit insertion with one partition and two sets. In this example, the decoding in this table corresponds to the encoding shown in FIG. 4E. The left column (610) and center column (611) show the received set indicator (SI) and received intra-set information (ISI), respectively, and comprise the compressed value. In some embodiments, the checks are performed in the order shown (e.g., starting with the least number of received ISI bits that need to be read out from the storage and ending the most number of received ISI bits)

In the top row (615), if the received SI=0 and the received ISI≤$2^{w_1}-1$ (which are not contradictory statements) then the decoded value of the offset (or other value) is the received ISI and has $w_1$ bits.

In the middle row (616), if the received SI=1 and the received ISI≤$2^{w_1}-1$ (which are contradictory statements), then it is determined or otherwise concluded that an extraneous bit was excluded during encoding and a corresponding replacement bit is inserted, for example by adding $2^{w_1}$ to the received ISI (which has (w−1) bits) to obtain the decoded value.

In the bottom row (617), if the received SI=1 and the received ISI is within the range of [$2^{(w_1+1)}$, $2^w-1$], then the decoded offset (or other value) is the received ISI which in this case has w bits.

As shown in this example, in some embodiments, a first partition in the sliding window is located at $2^{w_1}$; and generating the uncompressed value further includes: determining which one of a plurality of sets is indicated by the set indicator; and in the event (1) it is determined that the extraneous bit in the uncompressed value was excluded from the intra-set information during encoding and it (2) is determined that the set indicator indicates a first set, inserting the replacement bit includes adding $2^{w_1}$ to the intra-set information.

It is noted that different bit lengths are read out depending upon the decoded value (see, e.g., the different bit lengths in right column (612) in FIG. 6B). In some applications, it may be desirable to avoid reading out extra bits from some buffer, shift register, other memory that stores a received sequence of bits (e.g., the received set indicators, received intra-set information, etc.). As such, in some embodiments, a first partition in the sliding window is located at $2^{w_1}$; and generating the uncompressed value (e.g., at step 504 in FIG. 5) further includes: determining which one of a plurality of sets is indicated by the set indicator; and in the event it is determined that the set indicator indicates a first set, reading out $w_1$ bits corresponding to the intra-set information from a memory or storage that stores at least the intra-set information. See, for example, the top row (615) in FIG. 6B.

In some embodiments, the sliding window has a size of $2^w$; a first partition in the sliding window is located at $2^{w_1}$; and there are two sets in the sliding window; and generating the uncompressed value further includes: determining which one of a plurality of sets is indicated by the set indicator; in the event it is determined that the set indicator indicates a first set, reading out $w_1$ bits corresponding to the intra-set information from a storage that stores at least the intra-set information; and in the event it is determined that the set indicator indicates a second set and the intra-set information is less than or equal to $2^{w_1}-1$, reading out $w-1$ bits corresponding to the intra-set information from the memory. See, for example, the top and center rows (615 and 616) in FIG. 6B.

The following figure illustrates an example of a decoder that inputs compressed data and outputs decompressed data using a sliding window that includes one or more partitions.

Figure 7:
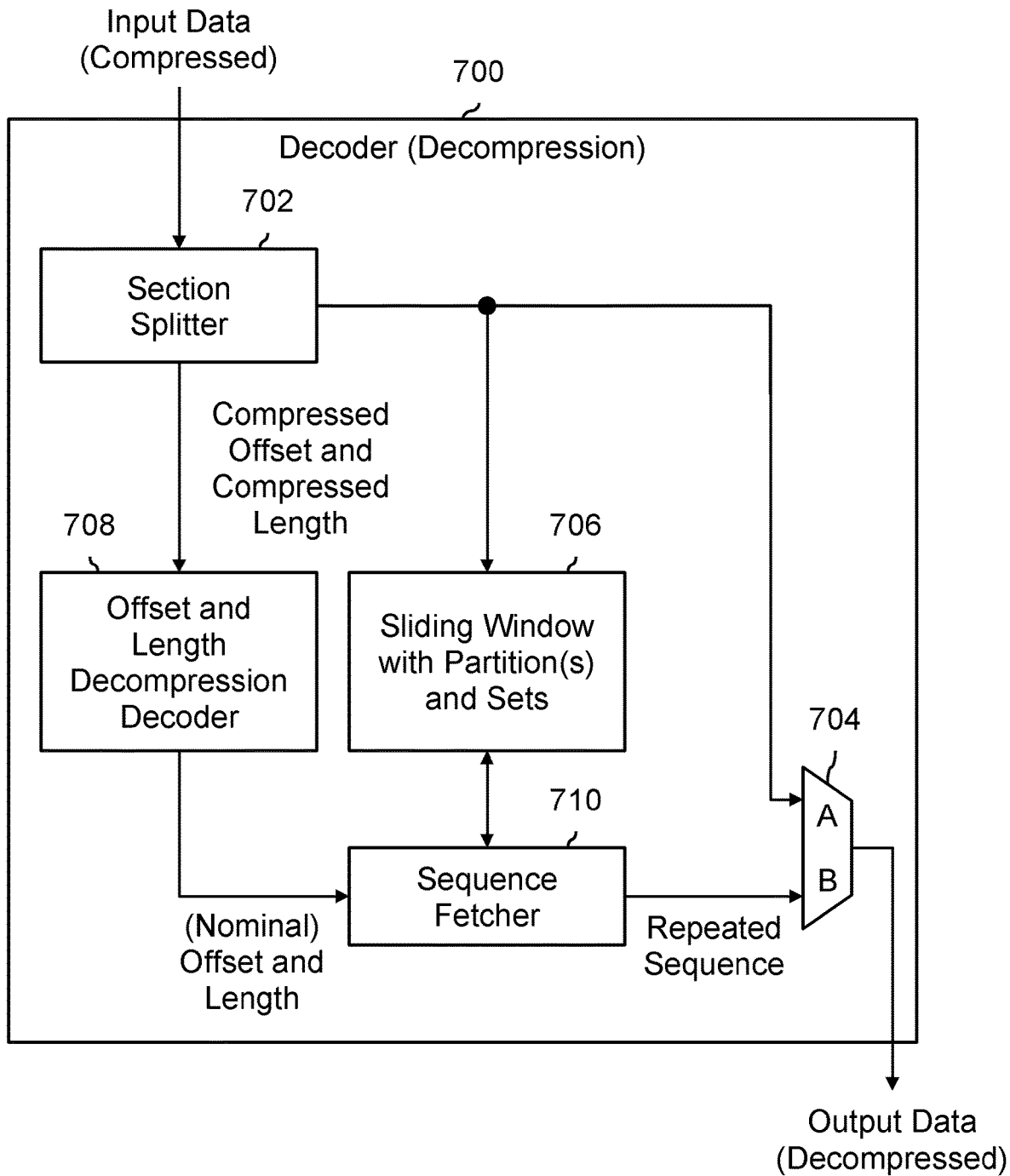
FIG. 7 is a diagram illustrating an embodiment of a decoder that inputs compressed data and outputs decompressed data using a sliding window that includes one or more partitions.

FIG. 7 is a diagram illustrating an embodiment of a decoder that inputs compressed data and outputs decompressed data using a sliding window that includes one or more partitions. The exemplary decoder (700) shown here corresponds to the example encoder (300) shown in FIG. 3. To preserve the readability of the diagram and for simplicity, some components which were shown in FIG. 3 (e.g., the sets (312a and 312b), partitions (313), and delay match (310)) are not illustrated here.

Input data which is compressed is passed to a section splitter (702) in the decoder (700). In this example, the input data includes different sections, sections which are associated with a repeated sequence (e.g., described by an offset and length pair), as well as sections which are not associated with a repeated sequence and contain the uncompressed data itself (e.g., a repeated sequence was not able to be identified for that section at the encoder). For example, the section splitter may look for reserved headers or specific sequences that identify the start of such sections, or knows the size of the previous section and counts the bits/symbols to determine the start of the next section.

For those sections which are not associated with a repeated sequence, the section splitter (702) outputs the input data to a multiplexer (704) so that those sections can be output by the multiplexer as the uncompressed output data. Those sections are also passed by the section splitter (702) to a sliding window with partition(s) and sets (706) so that they are available for future retrieval if needed.

For those sections which are associated with a repeated sequence, the section splitter (702) outputs that section (e.g., comprising a compressed offset and a compressed length) to an offset and length decompression decoder (708). In some embodiments, this decoder (708) performs the decoding process of FIG. 5.

The offset and length decompression decoder (708) outputs the (nominal) offset and length to a sequence fetcher (710) which accesses the sliding window (706) at the specified offset and retrieves the specified length to obtain the repeated sequence. The sliding window (706) may update itself to reflect the repeated sequence that was just fetched (e.g., in case that section of the data is subsequently referenced and needs to be copied).

The repeated sequence is passed by the sequence fetcher (710) to the multiplexer (704) which outputs the repeated sequence as the decompressed output data. Generally speaking, the multiplexer will switch as appropriate between the section splitter (702) for those sections that are not associated with repeated sequences and the sequence fetcher (710) for those sections that are associated with repeated sequences (e.g., the multiplexer's control or select signal is controlled by the section splitter (702) depending upon the current section).

Returning briefly to the exemplary sliding window shown in FIG. 4A, it is noted that the technique described herein is not necessarily constrained or otherwise limited to sliding windows with two partitions. The following figures describe an encoding and decoding example with two partitions and three sets from which embodiments with additional partitions/sets can be extrapolated.

FIG. 8A is a table illustrating an embodiment of a partial encoding scheme using a sliding window with two partitions and three sets before extraneous bit elimination. As in the two-set example above, this is only part of the encoded scheme so that extraneous bits (which are later discarded) can be illustrated.

In this example, the left column (800) shows the offset values (X) corresponding to each of the three sets: $X \leq 2^{w_1}-1$, $2^{w_1} \leq X \leq 2^{w_2}-1$, and $2^{w_2} \leq X \leq 2^w-1$ per the top to bottom rows (805-807), respectively. The center column (801) shows the values of the set indicator that are used for each of the three sets: 0, 10, and 11. As shown in this example, in some embodiments, the set indicator is a variable length field (e.g., a length of 1 or 2 bits). The right column (802) shows the values of the partially encoded intra-set information that are used for each of the three sets: $w_1$ bits of X (see the top row (805)), $w_2$ bits of X (see the middle row (806)), and w bits of X (see the bottom row (807)).

The following figure shows some specific values within those three partitions.

FIG. 8B is a table illustrating an embodiment of encoded offsets where extraneous bits are eliminated using two partitions and three sets when $w_1=8$, $w_2=10$, and $w=12$. In this example, the leftmost column (810) shows some example values of the offset (X). The second from left column (811) shows those offset values in binary. The second from right column (812) shows the compressed offset, comprising the set indicator (SI) and the intra-set information (ISI) with extraneous bits shown with a strikethrough and which are discarded. This is similar to the two-partition example described above and for brevity this discussion is skipped in this example. To help differentiate between the set indicator (SI) and the intra-set information (ISI), a vertical line is inserted between the two in the compressed offset column (812). The rightmost column (813) shows the length of the set indicator (SI) and the intra-set information (ISI) (i.e., the length of the compressed offset).

In the first row (820), the example offset value is 255 which is 1111 1111 in binary and has a compressed offset of 0 | 1111 1111. This produces a compressed length of 9 bits.

The second and third rows (821 and 822) show example offset values where an extraneous bit can be discarded. In those examples, offset values are 256 and 511 which are 1 0000 0000 and 1 1111 1111 in binary, respectively. The offset (X) in binary column (811) has the leading and/or extraneous bits in those rows (821 and 822) underlined. The compressed offsets for those values are 10 | 0̶ 0000 0000 (i.e., 10 | 000000000 after the struck through bit is discarded) and 10 | 0̶ 111 1111 (i.e., 10 | 0 1111 1111 after the struck through bit is discarded). This reduces the compressed length from 12 bits to 11 bits.

In the fourth and fifth rows (823 and 824), the example offset values are 512 and 1023 which are 10 00000000 and 11 1111 1111 in binary, respectively, and have compressed offsets of 10 | 10 0000 0000 and 10 | 11 1111 1111. This corresponds to a compressed length of 12 bits.

The sixth and seventh rows (825 and 826) show example offset values where a (second) extraneous bit is discarded. The example offset values here are 1024 and 2047 which are 100 0000 0000 and 111 1111 1111 in binary, respectively, with the extraneous and/or leading bits underlined. The compressed offsets for those values are 11 | 0̶ 00 00000000 (i.e., 11 | 000 0000 0000) and 11 | 0̶ 11 1111 1111 (i.e., 11 | 011 1111 1111). This reduces the compressed length from 14 bits to 13 bits.

The eighth row (827) shows an example offset value of 2048 which in binary is 1000 0000 0000; this results in a compressed offset of 11 | 1000 0000 0000 which has a length of 14 bits.

The following table shows this more generally and/or formally.

FIG. 8C is a table illustrating an embodiment of encoded offsets where extraneous bits are eliminated using two partitions and three sets. In this example, the leftmost column (830) shows the values of the offset, the second from left column (831) shows the corresponding set indicator (SI), the second from right column (832) shows the corresponding intra-set information (ISI), and the rightmost column (833) shows the length of the encoded offset (i.e., the length of the set indicator and intra-set information).

The first row (840) shows offset values in the range of $X \leq 2^{w_1}-1$. These offset values are encoded with a set indicator (SI) of 0 and intra-set information (ISI) comprising $w_1$ bits of X which produces a length of $w_1+1$.

The second row (841) shows offset values in the range of $2^{w_1} \leq X \leq 2^{(w_1+1)}-1$. These offset values are encoded with a set indicator (SI) of 10 and intra-set information (ISI) comprising $w_2-1$ bits of X (e.g., the leading bit of X is discarded) which produces a length of $w_2+1$.

The third row (842) shows offset values in the range of $2^{(w_1+1)} \leq X \leq 2^{w_2}-1$. These offset values are encoded with a set indicator (SI) of 10 and intra-set information (ISI) comprising $w_2$ bits of X which results in a length of $w_2+2$.

The fourth row (843) shows offset values in the range of $2^{w_2} \leq X \leq 2^{(w_2+1)}-1$ These offset values are encoded with a set indicator (SI) of 11 and intra-set information (ISI) comprising $w-1$ bits of X (e.g., the leading bit of X is discarded) which produces a length of $w+1$.

The fifth row (844) shows offset values in the range of $2^{(w_2+1)} \leq X \leq 2^w-1$. These offset values are encoded with a set indicator (SI) of 11 and intra-set information (ISI) comprising w bits of X which produces a length of $w+2$.

As shown in the example of FIGS. 8A-8C, in some embodiments, a first partition in the plurality of partitions has a size of $2^{w_1}$; a second partition in the plurality of partitions has a size of $2^{w_2}$; in the event the uncompressed value is within a range of $[2^{w_1}, 2^{(w_1+1)}-1]$: the uncompressed value is determined to include the extraneous bit; and the extraneous bit in the uncompressed value that is excluded from the intra-set information includes a leading bit within the range of $[2^{w_1}, 2^{(w_1+1)}-1]$; and in the event the uncompressed value is within a range of $[2^{w_2}, 2^{(w_2+1)}-1]$: the uncompressed value is determined to include the extraneous bit; and the extraneous bit in the uncompressed value that is excluded from the intra-set information includes a leading bit within the range of $[2^{w_2}, 2^{(w_2+1)}-1]$.

In some embodiments, sliding windows (e.g., the sliding window (302) in FIG. 3 and/or the sliding window (706) in FIG. 7) are implemented on SRAM. Although SRAM is attractive due to its ability to conserve power and reduce size, storing a sliding window on SRAM has a negative effect on the maximum length of an identified match and/or repeated pattern. For example, suppose the sliding window (302) in FIG. 3 has a size of $2^{12}$ (i.e., w=12) but the sliding window is stored on an SRAM with a read size of 256 (e.g., a single read of the SRAM returns read data with a size of 256 (e.g., bits or bytes)). As a result of this, a match identifier (e.g., the match identifier (304) in FIG. 3) may be limited to identifying repeated patterns with a maximum length of 256 (i.e., the read size) even though the sliding window is larger.

In particular, single runs (e.g., a sequence where a single symbol or bit is repeated R times) may have a run length (R) that is larger than the read size and using the encoding technique described above for single runs is inefficient. To improve the compression rate, in some embodiments, the exemplary encoding process described above has a special and/or corner case where single runs are encoded and/or handled differently. The following figure shows an example of this.

FIG. 9 is a table illustrating an embodiment of decoding with replacement bit insertion with two partitions and three sets. In this example, the left column (900) shows the set information that is received, the center column (901) shows intra-set information that is received, and the right column (902) shows the decoded value (in this example, the length (X)). In some embodiments, the decoding checks are performed in the order shown here (e.g., from the top row (910) to the bottom row (914)).

As shown in the first row (910) if the received set information is 0 and the received intra-set information is less than or equal to $2^{w_1}-1$, then the decoded value is the received intra-set information where $w_1$ bits of received intra-set information are read out from a memory or storage that stores the received intra-set information.

Per the second row (911) if the received set information is 10 and the received intra-set information is less than or equal to $2^{w_1}-1$, then the decoded value is the received intra-set information plus $2^{w_1}$ where the received intra-set information has $w_2-1$ bits.

Per the third row (912), if the received set information is 10 and the received intra-set information is within the range of $[2^{(w_1+1)}, 2^{w_2}-1]$, then the decoded value is the received intra-set information where the received intra-set information has $w_2$ bits.

Per the fourth row (913), if the received set information is 11 and the received intra-set information is less than or equal to $2^{w_2}-1$, then the decoded value is the received intra-set information plus $2^{w_2}$ where the received intra-set information has w−1 bits.

Per the fifth row (914), if the received set information is 11 and the received intra-set information is within the range of $[2^{(w_2+1)}, 2^{w}-1]$, then the decoded value is the received intra-set information where the received intra-set information has w bits.

Figure 10:
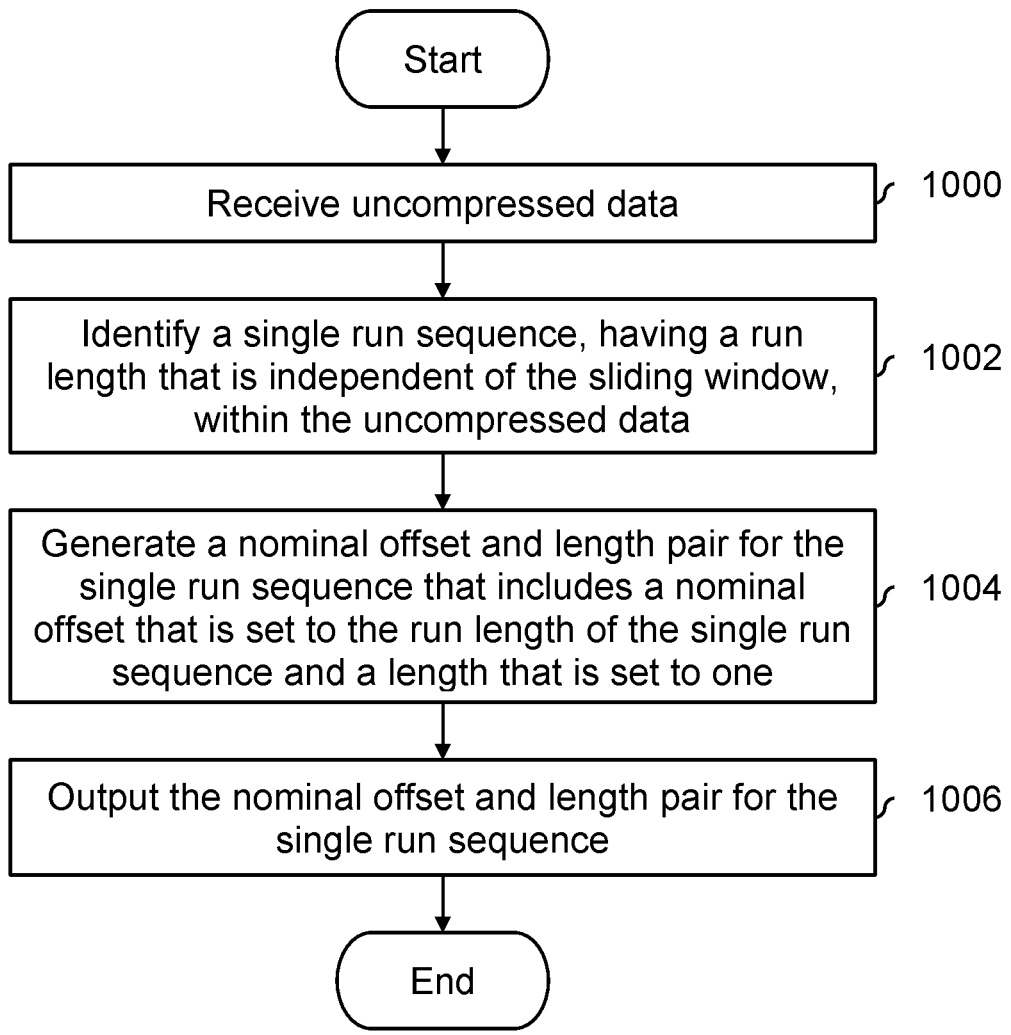
FIG. 10 is a flowchart illustrating an embodiment of an encoding process that encodes single run sequences by including a run length in a nominal offset and length pair.

FIG. 10 is a flowchart illustrating an embodiment of an encoding process that encodes single run sequences by including a run length in a nominal offset and length pair. In some embodiments, the exemplary process is performed by match identifier (304) in FIG. 3. In some embodiments, the exemplary process is performed in combination with the encoding process of FIG. 1.

At 1000, uncompressed data is received. See, for example, the uncompressed data that is input to the match identifier (304) in FIG. 3.

At 1002, a single run sequence is identified, having a run length (R) that is independent of the sliding window, within the uncompressed data. For example, in addition to finding repeated sequences within the uncompressed data that also occur in the sliding window, the match identifier (304) can (alternatively) identify a section of the uncompressed data as single run sequences. For example, if the uncompressed data coming in to the match identifier (304) is a run of all zeros or all ones, then the match identifier can flag this as a single run sequence.

At 1004, a nominal offset and length pair is generated for the single run sequence that includes a nominal offset that is set to the run length of the single run sequence and a length that is set to one. As used herein, a nominal offset and length pair is a pair of values that in some cases (e.g., when the length is greater than or equal to 2) is an offset and length relative to and/or within a sliding window but in other cases (e.g., when the length equals 1) the (nominal) offset is not an offset (location) within the sliding window but rather a run length to use in repeating a preceding symbol or bit.

At 1006, the nominal offset and length pair for the single run sequence is output. For example, the match identifier (304) in FIG. 3 may output the nominal offset and length pair to the offset and length compression encoder (306) for compression as described above.

The following figure illustrates an example of a corresponding decoding process.

Figure 11:
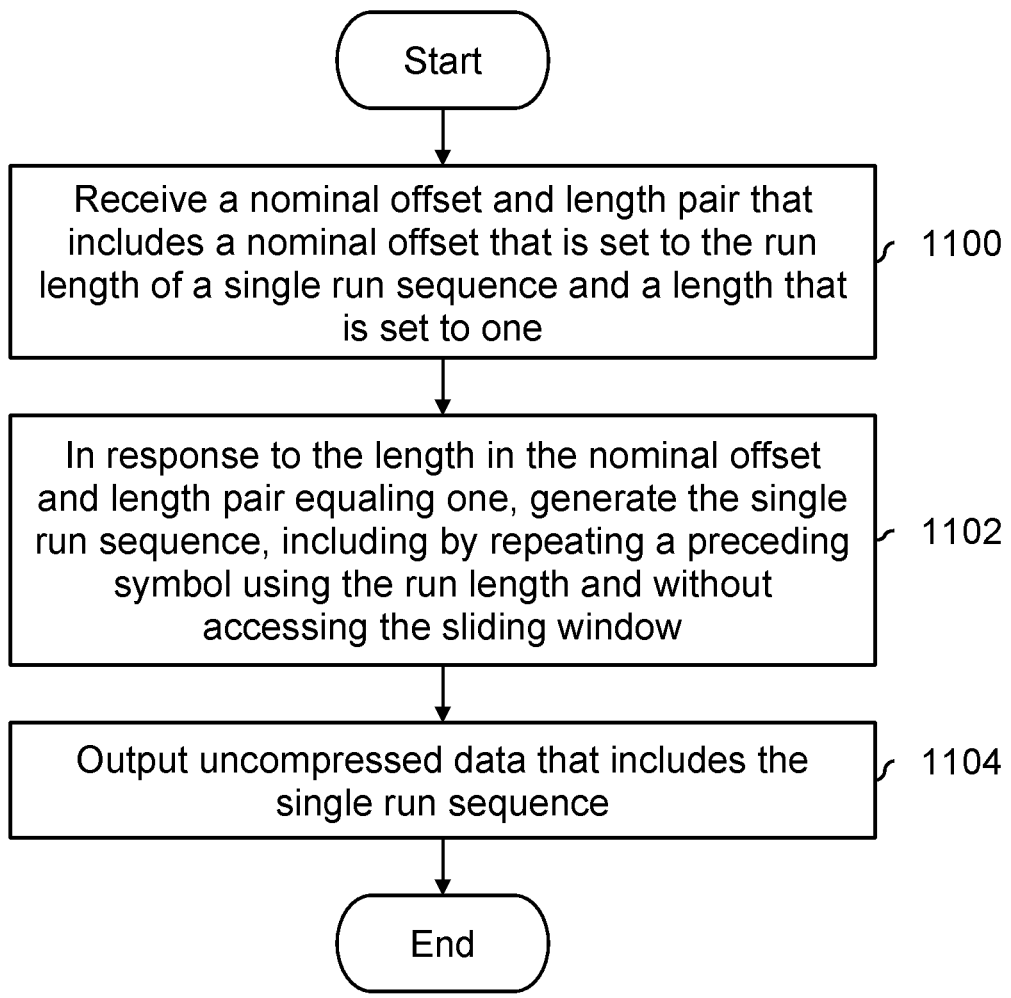
FIG. 11 is a flowchart illustrating an embodiment of a decoding process that decodes single run sequences where the run length is included in a nominal offset and length pair.

FIG. 11 is a flowchart illustrating an embodiment of a decoding process that decodes single run sequences where the run length is included in a nominal offset and length pair. In some embodiments, the exemplary process is performed by sequence fetcher (710) in FIG. 7. In some embodiments, the exemplary process is performed in combination with the decoding process of FIG. 5.

At 1100, a nominal offset and length pair that includes a nominal offset that is set to the run length of a single run sequence and a length that is set to one is received. See, for example, sequence fetcher (710) in FIG. 7 which inputs a (nominal) offset and length.

At 1102, in response to the length in the nominal offset and length pair equaling one, generate the single run sequence, including by repeating a preceding symbol using the run length and without accessing the sliding window. For example, the sequence fetcher may store a most recent symbol or bit in case a single run sequence occurs. To perform the copying operation, in some embodiments, a memset (or similar) command may be called (e.g., in computer software embodiments) or a (e.g., byte) duplication circuit may be used (e.g., in hardware embodiments).

In contrast, if the length in the nominal offset and length pair is greater than or equal to two, then the sliding window is accessed at the specified offset and for the specified length to obtain the repeated sequence.

At 1104, uncompressed data that includes the single run sequence is output. As described above, this uncompressed data may include sections for which a repeated sequence was not identified at the encoder (see, e.g., the A input at the multiplexer (704) in FIG. 7), or sections of repeated sequences which were fetched from a sliding window (e.g., sliding window (706) in FIG. 7), etc.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. An encoding system, comprising:
a memory; and
a processor coupled to the memory and configured to:
receive partition information associated with one or more partitions in a sliding window;
receive an uncompressed value associated with a repeated sequence in the sliding window;
generate a compressed value that includes a set indicator and intra-set information using the uncompressed value, including by:
generating the set indicator based at least in part on the partition information and the uncompressed value;
determining, based at least in part on the partition information and the uncompressed value, whether the uncompressed value includes an extraneous bit; and
generating the intra-set information, including by: in the event it is determined that the uncompressed value includes the extraneous bit, excluding the extraneous bit in the uncompressed value from the intra-set information; and
output the compressed value that includes the set indicator and the intra-set information.

2. The encoding system of claim 1, wherein:
a first partition in the sliding window is located at $2^{w_1}$; and
in the event the uncompressed value is within a range of $[2^{w_1}, 2^{(w_1+1)}-1]$:
the uncompressed value is determined to include the extraneous bit; and
the extraneous bit in the uncompressed value that is excluded from the intra-set information includes a leading bit within the range of $[2^{w_1}, 2^{(w_1+1)}-1]$.

3. The encoding system of claim 1, wherein:
a first partition in the sliding window is located at $2^{w_1}$;
a second partition in the sliding window is located at $2^{w_2}$;
in the event the uncompressed value is within a range of $[2^{w_1}, 2^{(w_1+1)}-1]$:
the uncompressed value is determined to include the extraneous bit; and
the extraneous bit in the uncompressed value that is excluded from the intra-set information includes a leading bit within the range of $[2^{w_1}, 2^{(w_1+1)}-1]$; and in the event the uncompressed value is within a range of $[2^{w_2}, 2^{(w_2+1)}-1]$:
  the uncompressed value is determined to include the extraneous bit; and
  the extraneous bit in the uncompressed value that is excluded from the intra-set information includes a leading bit within the range of $[2^{w_2}, 2^{(w_2+1)}-1]$.

4. The encoding system of claim 1, wherein the processor is further configured to:
receive uncompressed data;
identify a single run sequence, having a run length that is independent of the sliding window, within the uncompressed data;
generate a nominal offset and length pair for the single run sequence that includes a nominal offset that is set to the run length of the single run sequence and a length that is set to one; and
output the nominal offset and length pair for the single run sequence.

5. A method of encoding, comprising:
receiving partition information associated with one or more partitions in a sliding window;
receiving an uncompressed value associated with a repeated sequence in the sliding window;
generating a compressed value that includes a set indicator and intra-set information using the uncompressed value, including by:
  generating the set indicator based at least in part on the partition information and the uncompressed value;
  determining, based at least in part on the partition information and the uncompressed value, whether the uncompressed value includes an extraneous bit; and
  generating the intra-set information, including by: in the event it is determined that the uncompressed value includes the extraneous bit, excluding the extraneous bit in the uncompressed value from the intra-set information; and
outputting the compressed value that includes the set indicator and the intra-set information.

6. The method of encoding of claim 5, wherein:
a first partition in the sliding window is located at $2^{w_1}$; and
in the event the uncompressed value is within a range of $[2^{w_1}, 2^{(w_1+1)}-1]$:
  the uncompressed value is determined to include the extraneous bit; and
  the extraneous bit in the uncompressed value that is excluded from the intra-set information includes a leading bit within the range of $[2^{w_1}, 2^{(w_1+1)}-1]$.

7. The method of encoding of claim 5, wherein:
a first partition in the sliding window is located at $2^{w_1}$;
a second partition in the sliding window is located at $2^{w_2}$;
in the event the uncompressed value is within a range of $[2^{w_1}, 2^{(w_1+1)}-1]$:
  the uncompressed value is determined to include the extraneous bit; and
  the extraneous bit in the uncompressed value that is excluded from the intra-set information includes a leading bit within the range of $[2^{w_1}, 2^{(w_1+1)}-1]$; and
in the event the uncompressed value is within a range of $[2^{w_2}, 2^{(w_2+1)}-1]$:
  the uncompressed value is determined to include the extraneous bit; and
  the extraneous bit in the uncompressed value that is excluded from the intra-set information includes a leading bit within the range of $[2^{w_2}, 2^{(w_2+1)}-1]$.

8. The method of encoding of claim 5, further comprising:
receiving uncompressed data;
identifying a single run sequence, having a run length that is independent of the sliding window, within the uncompressed data;
generating a nominal offset and length pair for the single run sequence that includes a nominal offset that is set to the run length of the single run sequence and a length that is set to one; and
outputting the nominal offset and length pair for the single run sequence.

9. A decoding system, comprising:
a memory; and
a processor coupled to the memory and configured to:
  receive partition information associated with one or more partitions in a sliding window;
  receive a compressed value that includes a set indicator and intra-set information;
  generate an uncompressed value that is associated with a repeated sequence in the sliding window using the compressed value, including by:
    determining, based at least in part on the set indicator and the intra-set information, whether an extraneous bit in the uncompressed value was excluded from the intra-set information during encoding; and
    generating the uncompressed value, including by: in the event it is determined that the extraneous bit in the uncompressed value was excluded from the intra-set information during encoding, inserting a replacement bit into the intra-set information in order to obtain the uncompressed value; and
  output the uncompressed value that is associated with the repeated sequence in the sliding window.

10. The decoding system of claim 9, wherein:
a first partition in the sliding window is located at $2^{w_1}$; and
generating the uncompressed value further includes:
  determining which one of a plurality of sets is indicated by the set indicator; and
  in the event (1) it is determined that the extraneous bit in the uncompressed value was excluded from the intra-set information during encoding and (2) it is determined that the set indicator indicates a first set, inserting the replacement bit includes adding $2^{w_1}$ to the intra-set information.

11. The decoding system of claim 9, wherein:
a first partition in the sliding window is located at $2^{w_1}$;
a second partition in the sliding window is located at $2^{w_2}$; and
generating the uncompressed value further includes:
  determining which one of a plurality of sets is indicated by the set indicator;
  in the event (1) it is determined that the extraneous bit in the uncompressed value was excluded from the intra-set information during encoding and (2) it is determined that the set indicator indicates a first set, inserting the replacement bit includes adding $2^{w_1}$ to the intra-set information; and
  in the event (1) it is determined that the extraneous bit in the uncompressed value was excluded from the intra-set information during encoding and (2) it is determined that the set indicator indicates a second set, inserting the replacement bit includes adding $2^{w_2}$ to the intra-set information.

12. The decoding system of claim 9, wherein:
a first partition in the sliding window is located at $2^{w_1}$; and
generating the uncompressed value further includes:
- determining which one of a plurality of sets is indicated by the set indicator; and
- in the event it is determined that the set indicator indicates a first set, reading out $w_1$ bits corresponding to the intra-set information from a storage that stores at least the intra-set information.

13. The decoding system of claim 9, wherein:
the sliding window has a size of $2^w$;
is a first partition in the sliding window is located at $2^{w_1}$;
there are two sets in the sliding window; and
generating the uncompressed value further includes:
- determining which one of a plurality of sets is indicated by the set indicator;
- in the event it is determined that the set indicator indicates a first set, reading out $w_1$ bits corresponding to the intra-set information from a storage that stores at least the intra-set information; and
- in the event it is determined that the set indicator indicates a second set and the intra-set information is less than or equal to $2^{w_1}-1$, reading out w−1 bits corresponding to the intra-set information from the memory.

14. The decoding system of claim 9, wherein the processor is further configured to:
- receive a nominal offset and length pair that includes a nominal offset that is set to a run length of a single run sequence and a length that is set to one;
- in response to the length in the nominal offset and length pair equaling one, generate the single run sequence, including by repeating a preceding symbol using the run length and without accessing the sliding window; and
- output uncompressed data that includes the single run sequence.

15. A method of decoding, comprising:
- receiving partition information associated with one or more partitions in a sliding window;
- receiving a compressed value that includes a set indicator and intra-set information;
- generating an uncompressed value that is associated with a repeated sequence in the sliding window using the compressed value, including by:
  - determining, based at least in part on the set indicator and the intra-set information, whether an extraneous bit in the uncompressed value was excluded from the intra-set information during encoding; and
  - generating the uncompressed value, including by: in the event it is determined that the extraneous bit in the uncompressed value was excluded from the intra-set information during encoding, inserting a replacement bit into the intra-set information in order to obtain the uncompressed value; and
- outputting the uncompressed value that is associated with the repeated sequence in the sliding window.

16. The method of decoding of claim 15, wherein:
a first partition in the sliding window is located at $2^{w_1}$; and
generating the uncompressed value further includes:
- determining which one of a plurality of sets is indicated by the set indicator; and
- in the event (1) it is determined that the extraneous bit in the uncompressed value was excluded from the intra-set information during encoding and (2) it is determined that the set indicator indicates a first set, inserting the replacement bit includes adding $2^{w_1}$ to the intra-set information.

17. The method of decoding of claim 15, wherein:
a first partition in the sliding window is located at $2^{w_1}$;
a second partition in the sliding window is located at $2^{w_2}$; and
generating the uncompressed value further includes:
- determining which one of a plurality of sets is indicated by the set indicator;
- in the event (1) it is determined that the extraneous bit in the uncompressed value was excluded from the intra-set information during encoding and (2) it is determined that the set indicator indicates a first set, inserting the replacement bit includes adding $2^{w_1}$ to the intra-set information; and
- in the event (1) it is determined that the extraneous bit in the uncompressed value was excluded from the intra-set information during encoding and (2) it is determined that the set indicator indicates a second set, inserting the replacement bit includes adding $2^{w_2}$ to the intra-set information.

18. The method of decoding of claim 15, wherein:
a first partition in the sliding window is located at $2^{w_1}$; and
generating the uncompressed value further includes:
- determining which one of a plurality of sets is indicated by the set indicator; and
- in the event it is determined that the set indicator indicates a first set, reading out $w_1$ bits corresponding to the intra-set information from a storage that stores at least the intra-set information.

19. The method of decoding of claim 15, wherein:
the sliding window has a size of $2^w$;
a first partition in the sliding window is located at $2^{w_1}$;
there are two sets in the sliding window; and
generating the uncompressed value further includes:
- determining which one of a plurality of sets is indicated by the set indicator;
- in the event it is determined that the set indicator indicates a first set, reading out $w_1$ bits corresponding to the intra-set information from a storage that stores at least the intra-set information; and
- in the event it is determined that the set indicator indicates a second set and the intra-set information is less than or equal to $2^{w_1}-1$, reading out w−1 bits corresponding to the intra-set information from the memory.

20. The method of decoding of claim 15, further comprising:
- receiving a nominal offset and length pair that includes a nominal offset that is set to a run length of a single run sequence and a length that is set to one;
- in response to the length in the nominal offset and length pair equaling one, generating the single run sequence, including by repeating a preceding symbol using the run length and without accessing the sliding window; and
- outputting uncompressed data that includes the single run sequence.

* * * * *

UNITED STATES PATENT AND TRADEMARK OFFICE
CERTIFICATE OF CORRECTION

| | | |
|---|---|---|
| PATENT NO. | : 11,139,829 B1 | Page 1 of 1 |
| APPLICATION NO. | : 17/236386 | |
| DATED | : October 5, 2021 | |
| INVENTOR(S) | : Yingquan Wu | |

It is certified that error appears in the above-identified patent and that said Letters Patent is hereby corrected as shown below:

In the Specification

In Column 5, Line(s) 36, delete "2" and insert --$2^w$--, therefor.
In Column 7, Line(s) 50 & 51, delete "1 11111111" and insert --1 1111 1111--, therefor.
In Column 8, Line(s) 15, delete "0" and insert --$10^{th}$--, therefor.
In Column 13, Line(s) 12, delete "0 11111 1111" and insert --0 | 1111 1111--, therefor.
In Column 13, Line(s) 20, delete "10 | 000000000" and insert --10 | 0 0000 0000--, therefor.
In Column 13, Line(s) 21, delete "10 | 04 111 1111" and insert --10 | 04 1111 1111--, therefor.
In Column 13, Line(s) 25, delete "10 00000000" and insert --10 0000 0000--, therefor.
In Column 13, Line(s) 34 & 35, delete "11 | 04 00 00000000" and insert --11 | 0400 0000 0000--, therefor.

Signed and Sealed this
Nineteenth Day of July, 2022

Katherine Kelly Vidal
*Director of the United States Patent and Trademark Office*